(12) United States Patent
Shur et al.

(10) Patent No.: US 9,691,680 B2
(45) Date of Patent: Jun. 27, 2017

(54) STRUCTURED SUBSTRATE

(71) Applicant: Sensor Electronic Technology, Inc., Columbia, SC (US)

(72) Inventors: Michael Shur, Latham, NY (US); Maxim S. Shatalov, Columbia, SC (US); Alexander Dobrinsky, Loudonville, NY (US); Remigijus Gaska, Columbia, SC (US)

(73) Assignee: SENSOR ELECTRONIC TECHNOLOGY, INC., Columbia, SC (US)

( * ) Notice: Subject to any disclaimer, the term of this patent is extended or adjusted under 35 U.S.C. 154(b) by 0 days.

(21) Appl. No.: 14/683,184

(22) Filed: Apr. 10, 2015

(65) Prior Publication Data
US 2015/0295155 A1 Oct. 15, 2015

Related U.S. Application Data

(60) Provisional application No. 61/978,184, filed on Apr. 10, 2014, provisional application No. 61/978,185, filed on Apr. 10, 2014.

(51) Int. Cl.
*H01L 23/367* (2006.01)
*H01L 21/02* (2006.01)
(Continued)

(52) U.S. Cl.
CPC ........ *H01L 23/367* (2013.01); *H01L 21/0254* (2013.01); *H01L 21/02428* (2013.01); *H01L 21/4871* (2013.01); *H01L 21/76251* (2013.01); *H01L 23/3732* (2013.01); *H01L 23/3736* (2013.01); *H01L 33/641* (2013.01); *H01L 33/642* (2013.01); *H01L 29/0676* (2013.01); *H01L 29/2003* (2013.01); *H01L 29/7786* (2013.01); *H01L 33/007* (2013.01);
(Continued)

(58) Field of Classification Search
None
See application file for complete search history.

(56) References Cited

U.S. PATENT DOCUMENTS 5,313,094 A * 5/1994 Beyer ................. H01L 23/3178
257/622
5,324,987 A * 6/1994 Iacovangelo ....... H01L 23/3732
257/701

(Continued)

OTHER PUBLICATIONS

Choi, S., International Application No. PCT/US2015/025228, International Search Report and Written Opinion, Jul. 31, 2015, 7 pages.

(Continued)

*Primary Examiner* — Charles Garber
*Assistant Examiner* — Alia Sabur
(74) *Attorney, Agent, or Firm* — Labatt, LLC

(57) ABSTRACT

A structured substrate configured for epitaxial growth of a semiconductor layer thereon is provided. Structures can be formed on a side of the structured substrate opposite that of the growth surface for the semiconductor layer. The structures can include cavities and/or pillars, which can be patterned, randomly distributed, and/or the like. The structures can be configured to modify one or more properties of the substrate material such that growth of a higher quality semiconductor layer can be obtained.

20 Claims, 8 Drawing Sheets

(51) Int. Cl.
  *H01L 21/762*  (2006.01)
  *H01L 21/48*   (2006.01)
  *H01L 23/373*  (2006.01)
  *H01L 33/64*   (2010.01)
  *H01L 29/20*   (2006.01)
  *H01L 29/778*  (2006.01)
  *H01L 29/06*   (2006.01)
  *H01L 33/00*   (2010.01)

(52) U.S. Cl.
  CPC .. *H01L 33/0079* (2013.01); *H01L 2924/0002* (2013.01); *H01L 2933/0075* (2013.01)

(56) References Cited

U.S. PATENT DOCUMENTS

| | | | |
|---|---|---|---|
| 6,060,785 A | 5/2000 | New et al. | |
| 6,328,796 B1 | 12/2001 | Kub et al. | |
| 6,838,702 B1* | 1/2005 | Ho | H01L 33/642 |
| | | | 257/100 |
| 8,349,742 B2* | 1/2013 | Tu | H01L 21/02381 |
| | | | 117/952 |
| 8,981,403 B2 | 3/2015 | Shatalov et al. | |
| 2002/0096106 A1 | 7/2002 | Kub et al. | |
| 2003/0033974 A1 | 2/2003 | Ueda | |
| 2005/0059238 A1* | 3/2005 | Chen | H01L 21/4871 |
| | | | 438/672 |
| 2005/0230699 A1 | 10/2005 | Wu et al. | |
| 2006/0220036 A1* | 10/2006 | Lee | H01L 33/486 |
| | | | 257/81 |
| 2007/0069222 A1* | 3/2007 | Ko | H01L 33/642 |
| | | | 257/86 |
| 2011/0094668 A1 | 4/2011 | Le Vaillant | |
| 2012/0104355 A1 | 5/2012 | Grandusky et al. | |
| 2013/0032835 A1 | 2/2013 | Shatalov et al. | |
| 2013/0056745 A1 | 3/2013 | Chen | |
| 2013/0075781 A1 | 3/2013 | Chen | |
| 2013/0181327 A1 | 7/2013 | Miyoshi et al. | |
| 2014/0001486 A1 | 1/2014 | Bougrov et al. | |
| 2014/0042593 A1* | 2/2014 | Mauder | H01L 29/7827 |
| | | | 257/607 |
| 2014/0077224 A1* | 3/2014 | Li | H01L 29/66462 |
| | | | 257/77 |
| 2015/0295127 A1 | 10/2015 | Shur et al. | |

OTHER PUBLICATIONS

Sabur, A., U.S. Appl. No. 14/683,177, Office Action 1, Apr. 14, 2016, 22 pages.
Sabur, A., U.S. Appl. No. 14/681,177, Final Office Action 1, Oct. 5, 2016, 21 pages.
Sabur, A., U.S. Appl. No. 14/683,177, Notice of Allowance and AFCP Decision, Jan. 4, 2017, 13 pages.

* cited by examiner

STRUCTURED SUBSTRATE

REFERENCE TO RELATED APPLICATIONS

The current application claims the benefit of U.S. Provisional Application Nos. 61/978,184 and 61/978,185, both of which were filed on 10 Apr. 2014, and both of which are hereby incorporated by reference.

TECHNICAL FIELD

The disclosure relates generally to substrates, and more particularly, to a composite substrate for improved epitaxial growth of semiconductor layers thereon.

BACKGROUND ART

In epitaxial growth of semiconductor structures and devices, a substrate is needed on which the growth of the semiconductor material is initiated, and which serves as a support for the grown semiconductor layers. The properties of the substrate play a key role in the quality of the epitaxially grown semiconductor layers. For example, a lattice mismatch between the substrate and the semiconductor material epitaxially grown thereon causes stresses and can result in formation of dislocations in the semiconductor material. The dislocations can significantly deteriorate the performance of a semiconductor device, e.g. a light emitting diode (LED), formed on the substrate. Additionally, a difference in the thermal expansion coefficient between the substrate and the epitaxially grown layers can induce stresses in the semiconductor layers. Finally, a substrate can be used for efficient thermal management of the device provided that the substrate has an overall low thermal resistance. Thus, most preferably, the substrate should be formed of the same material to be grown epitaxially thereon. A situation in which the substrate and the epitaxially grown layers are of the same material is referred to as homoepitaxy.

Unfortunately, some widely used compound semiconductor materials such as, for example, gallium nitride (GaN) and other group III nitrides, have significant problems in their bulk fabrication. Production of bulk material in the form of single-crystal wafers can be so challenging and expensive that it is not suitable for industrial-scale manufacturing. In such cases, heterosubstrates (also known as foreign substrates), i.e., substrates formed of a material different from the material to be epitaxially grown thereon, must be used. However, despite carefully optimizing the substrate material for the actual semiconductor material to be grown, the adverse effects of crystal lattice mismatch and difference in thermal expansion between the heterosubstrate and the material to be grown thereon are difficult, if not impossible, to eliminate entirely. To avoid these undesirable effects, different kinds of semiconductor templates have been developed for epitaxial growth of different materials. Templates are typically multi-layered epitaxial structures adjusted to the heterosubstrate with a cap layer made of a material optimized for later epitaxial growth of the semiconductor device structures. By using such templates, e.g., a GaN device can be grown on a sapphire substrate. Such a template improves the quality of the epitaxial layers but is still not able to sufficiently suppress generation of thermomechanical stresses.

SUMMARY OF THE INVENTION

In view of the background, the inventors recognize a need for an effective and/or low cost solution for providing substrates for epitaxial growth of high-quality compound semiconductor layers thereon.

Aspects of the invention provide a structured substrate configured for epitaxial growth of a semiconductor layer thereon. Structures can be formed on a side of the structured substrate opposite that of the growth surface for the semiconductor layer. The structures can include cavities and/or pillars, which can be patterned, randomly distributed, and/or the like. The structures can be configured to modify one or more properties of the substrate material such that growth of a higher quality semiconductor layer can be obtained.

A first aspect of the invention provides a method of fabricating a heterostructure, the method comprising: selecting a target set of properties for a structured substrate based on a material of a semiconductor layer to be grown on a first surface of the structured substrate and a set of epitaxial growth conditions for the semiconductor layer; and forming a plurality of structures within the structured substrate according to the target set of properties, wherein the forming includes at least one of: forming a set of cavities or forming a set of pillars on a second surface of the structured substrate opposite the first surface.

A second aspect of the invention provides a method of fabricating a device, the method comprising: selecting a target set of properties for a structured substrate based on a material of a semiconductor layer to be grown on a first surface of the structured substrate and a set of epitaxial growth conditions for the semiconductor layer; forming a plurality of structures within the structured substrate according to the target set of properties, wherein the forming includes at least one of: forming a set of cavities or forming a set of pillars on a second surface of the structured substrate opposite the first surface; and growing a heterostructure for the device on the first surface of the structured substrate after the forming.

A third aspect of the invention provides a heterostructure including: a structured substrate including a first surface and a second surface opposite the first surface; a set of semiconductor layers epitaxially grown on the first surface of the structured substrate; and a layer of filler material immediately adjacent to the second surface of the structured substrate, wherein the filler material has a thermal expansion coefficient larger than that of a material of the structured substrate, wherein the filler material partially fills a plurality of voids formed on the second surface of the structured substrate.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a structured substrate configured for epitaxial growth of a semiconductor layer thereon. Structures can be formed on a side of the structured substrate opposite that of the growth surface for the semiconductor layer. The structures can include cavities and/or pillars, which can be patterned, randomly distributed, and/or the like. The structures can be configured to modify one or more properties of the substrate material such that growth of a higher quality semiconductor layer can be obtained. As used herein, unless otherwise noted, the term "set" means one or more (i.e., at least one) and the phrase "any solution" means any now known or later developed solution.

Aspects of the invention provide a solution in which a structured substrate is configured to promote epitaxial growth of a semiconductor layer thereon. For example, for a given set of growth conditions (e.g., temperature, pressure, time, steps, elements, molar ratios, and/or the like) to be utilized for epitaxially growing the semiconductor layer, a set of properties for the structured substrate can be selected to promote growth of a higher quality semiconductor layer, e.g., by reducing stresses present in the semiconductor layer during growth. Illustrative properties include thermal properties and/or mechanical properties. For example, a thermal expansion coefficient can be altered through the use of a structured substrate described herein. Furthermore, one or more elastic properties of the structured substrate, such as a biaxial elastic modulus, can be modified using a solution described herein. The substrate can be modified based on the target thermal and/or mechanical properties prior to growth of the semiconductor layer thereon. For example, structures, such as cavities, pillars, and/or the like, can be fabricated within the substrate to modify the thermal and/or mechanical properties in a desired manner.

Figure 1:
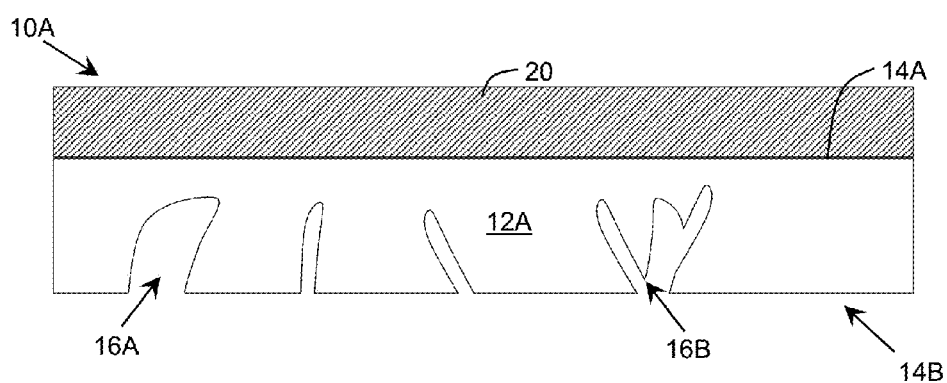
FIG. 1 shows a schematic of an illustrative heterostructure according to an embodiment.

Turning to the drawings, FIG. 1 shows a schematic of an illustrative heterostructure 10A according to an embodiment. As illustrated, the heterostructure 10A includes a structured substrate 12A and a semiconductor layer 20 grown directly thereon. Growth of the semiconductor layer 20 can use any epitaxial growth solution, e.g., a lateral epitaxial overgrowth technique. The structured substrate 12A can be formed of any type of substrate material typically utilized for growth of a semiconductor layer 20 of a target type of material thereon. For example, when the semiconductor layer 20 is a group III-V material (e.g., group III nitride, group III arsenide, and/or the like), illustrative materials for the structured substrate 12A include: sapphire, silicon carbide (SiC), silicon (Si), diamond, bulk AlN, bulk GaN, bulk AlGaN, AlON, LiNbO$_3$, LiGaO$_2$, GaO$_2$, or another suitable material. In an illustrative embodiment, the semiconductor layer 20 is a group III nitride material, such as aluminum nitride.

The structured substrate 12A includes a first surface 14A, on which the semiconductor layer 20 is epitaxially grown and an opposing surface 14B, which includes structure for the epitaxial growth of the semiconductor layer 20. For example the structure can include a plurality of cavities (pores), such as cavities 16A, 16B, formed in the opposing surface 14B and extending at least partially through the structured substrate 12A.

Figure 2A:
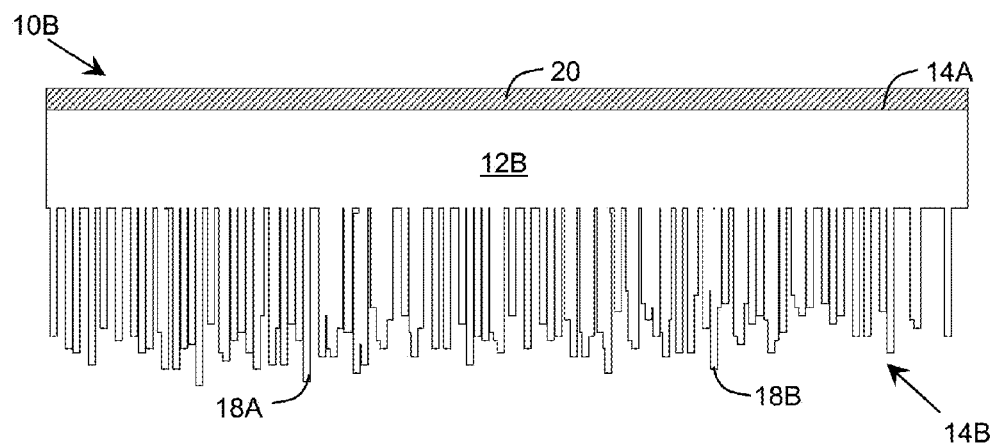
FIGS. 2A and 2B show schematics of an illustrative heterostructure according to another embodiment.
Figure 2B:
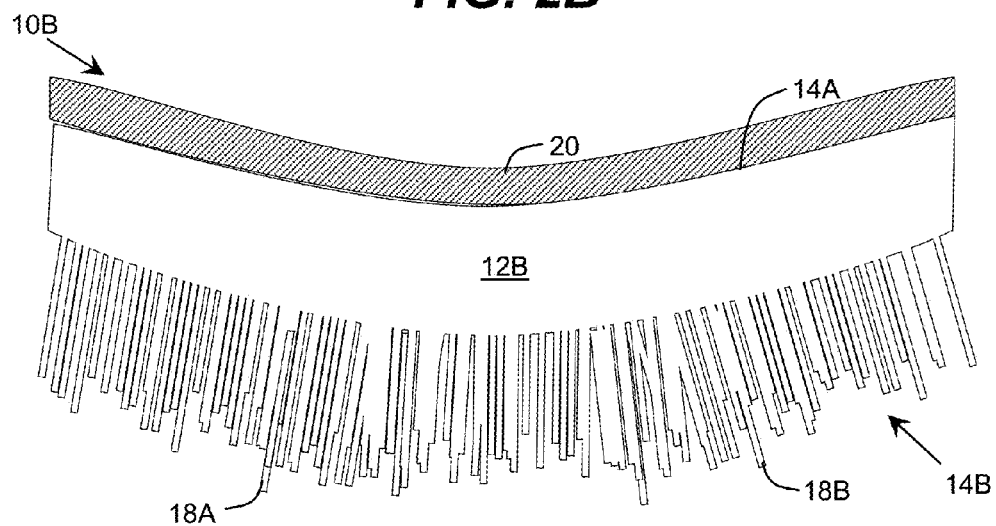
Figure 3:
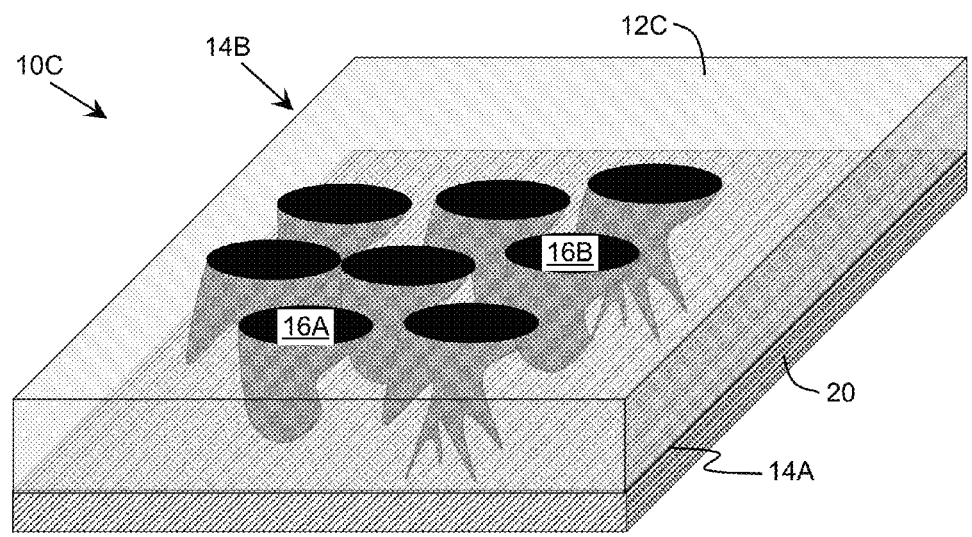
FIG. 3 shows a three dimensional schematic of an illustrative heterostructure according to an embodiment.
Figure 4:
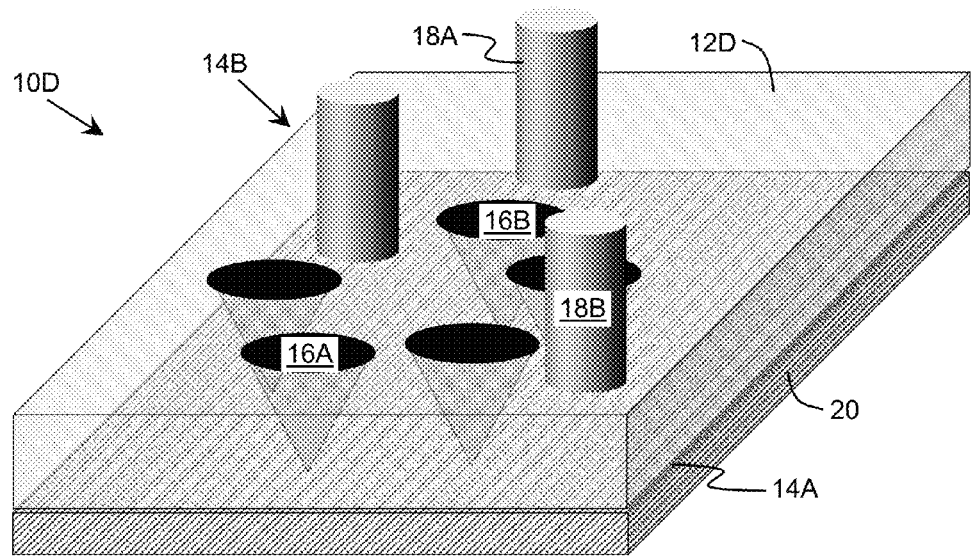
FIG. 4 shows a three dimensional schematic of another illustrative heterostructure according to an embodiment

FIGS. 2A and 2B show schematics of an illustrative heterostructure 10B according to another embodiment. In this case, the heterostructure 10B includes a structured substrate 12B and a semiconductor layer 20 grown directly on a first surface 14A of the structured substrate 12B, while the opposing surface 14B includes a plurality of pillars, such as pillars 18A, 18B. FIG. 3 shows a three dimensional schematic of an illustrative heterostructure 100 according to an embodiment, which includes a substrate 12C with cavities 16A, 16B having varying irregular shapes formed on the opposing surface 14B prior to growth of the semiconductor layer 20 on the surface 14A. FIG. 4 shows a three dimensional schematic of an illustrative heterostructure 10D according to an embodiment, in which both cavities 16A, 16B and pillars 18A, 18B are formed on the opposing surface 14B of the substrate 12D prior to growth of the semiconductor layer 20 on the surface 14A.

Referring to FIGS. 1-4, the structure of the substrates 12A-12D can be configured to tailor thermal and/or mechanical properties of the substrate 12A-12D to facilitate epitaxial growth of a semiconductor layer 20 of an increased quality over growth on a substrate without the structure. For example, the cavities 16A, 16B and/or pillars 18A, 18B can be configured to mitigate stresses within the epitaxially grown semiconductor layer 20. To this extent, the pillars 18A, 18B can alter a flexural modulus of the substrate 12B, 12D, e.g., in a manner similar, but not identical, to a thinned substrate. It is understood that cavities 16A, 16B and pillars 18A, 18B can be combined together to provide a set of desired thermal and/or mechanical properties of a structured substrate 12A-12D. As shown in FIG. 2B, the substrate 12B can flex during epitaxial growth of the semiconductor layer 20, which can result in stresses being relieved within the semiconductor layer 20. Inclusion of cavities 16A, 16B and/or pillars 18A, 18B affects, for example, the elastic properties of the structured substrate 12A-12D and results in changes in stresses present within the substrate 12A-12D and/or the semiconductor layer 20.

In an embodiment, a characteristic width (e.g., average diameter) of a cavity 16A, 16B and/or a pillar 18A, 18B of a structured substrate 12A-12D is in a range between approximately (e.g., within +/−ten percent of) 10 nanometers and approximately 10 microns. Additionally, a characteristic separation distance (e.g., as measured edge to edge) between immediately adjacent cavities 16A, 16B and/or immediately adjacent pillars 18A, 18B can be similar to (e.g., within +/−ten percent of) the corresponding characteristic width. A characteristic height (e.g., average height) of the pillars 18A, 18B and/or a characteristic depth (e.g., average depth) of the cavities 16A, 16B can be optimized to reduce stresses in the epitaxially grown semiconductor layer 20 at room temperature, subject to a constraint that the substrate 12A-12D remains intact throughout the device fabrication process. For example, the substrate 12A-12D can be configured to be capable of withstanding stresses generated within the substrate 12A-12D without developing a significant amount of (e.g., any) cracks. An approximate optimization of a structured substrate 12A-12D can be based on the relative volumes of the material(s) forming the structured substrate 12A-12D. For example, properties of the structured substrate 12A-12D can be derived using a volume weighted average of the mechanical and thermal coefficients of the material(s). Further optimization can be performed using numerical calculations of the structured substrate 12A-12D under stress. For instance, the numerical calculations can be carried out for a structured substrate 12A-12D comprising cavities of various depth and sizes. In this case, the depths and sizes can be an optimization parameter.

Each cavity 16A, 16B and pillar 18A, 18B can have any shape. For example, an embodiment includes formation of cavities 16A, 16B having conical shapes, as shown in FIG. 4. In a further embodiment, one or more cavities 16A, 16B can penetrate an entire thickness of the structured substrate 12A-12D, thereby forming opening(s) on the surface 14A of the structured substrate 12A-12D on which the semiconductor layer 20 is to be grown. An embodiment of a substrate 12A-12D can include cavities 16A, 16B and/or pillars 18A, 18B that are distributed substantially uniformly across a lateral surface area of the substrate 12A-12D. Alternatively, the distribution of either or both of the cavities 16A, 16B and/or pillars 18A, 18B can vary laterally.

Since cavities 16A, 16B and pillars 18A, 18B affect the elastic properties of the substrate 12A-12D differently, positioning of the cavities 16A, 16B and/or pillars 18A, 18B within the substrate 12A-12D can provide further control of the elastic properties of the substrate 12A-12D. For example, the cavities 16A, 16B can interchange with pillars 18A, 18B, which can provide a wide range of control of elastic properties of the substrate 12A-12D. It is understood that parameters for size, depth and characteristic separation of cavities 16A, 16B can be adjusted independently from the parameters for size, height and position of pillars 18A, 18B.

The structure of a substrate 12A-12D can be formed using a random, pseudo-random, and/or patterned solution. For example, the cavities 16A, 16B and/or pillars 18A, 18B can be formed through substrate etching. In this case, a mask, such as anodized aluminum oxide, can be applied on the surface 14B of the substrate 12A-12D, respectively, with openings where the substrate 12A-12D is to be etched and/or islands where the substrate 12A-12D is not to be etched. After etching is complete, the mask can be removed from the surface 14B of the substrate 12A-12D using any solution. The openings and/or islands can have a periodic and/or non-periodic pattern. Additionally, the openings/islands can include openings/islands of different sizes and/or shapes, and can have a density/distribution that is substantially uniform or varies laterally across the surface 14B. Masking and subsequent etching of the surface 14B can be repeated one or more times, e.g., to create any combination of cavities 16A, 16B and/or pillars 18A, 18B of varying depths/heights. Alternatively, another solution, such as photolithography, masking, anodization processes, and/or the like, can be used to form cavities 16A, 16B and/or pillars 18A, 18B.

Figure 5:
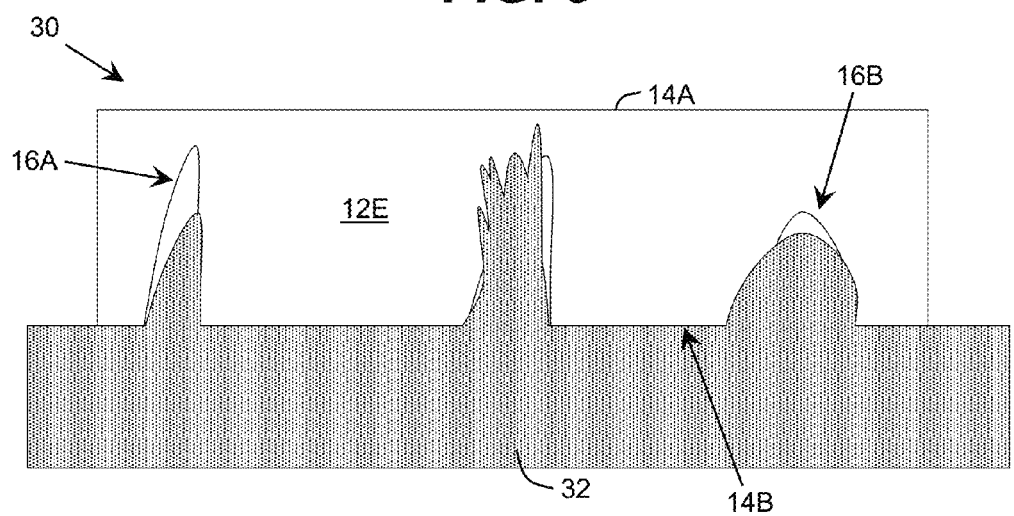
FIG. 5 shows a schematic of an illustrative compound substrate including a structured substrate and filler material according to an embodiment.

In an embodiment, a structured substrate 12A-12D includes filler material at least partially filling voids (e.g., the cavities 16A, 16B, areas around the pillars 18A, 18B, and/or the like) in the opposing surface 14B. For example, the filler material can be selected to provide further control of the mechanical and/or thermal properties of the structured substrate 12A-12D. To this extent, FIG. 5 shows a schematic of an illustrative compound substrate 30, which includes a structured substrate 12E and a layer of filler material 32 according to an embodiment. While not shown for clarity, it is understood that a semiconductor layer can be epitaxially grown on the surface 14A of the compound substrate 30.

As illustrated, the filler material 32 can at least partially fill some or all of the voids (e.g., cavities 16A, 16B) included in the structured substrate 12E. The filler material 32 can comprise a material having different thermal and/or mechanical properties than that of the structured substrate 12E. To this extent, when the filler material 32 has a thermal expansion coefficient larger than that of the material of the structured substrate 12E, the filler material 32 can only partially fill the cavities 16A, 16B to provide a volume for expansion. In an embodiment, a target filling factor (e.g., a percentage of the voids which is filled) is determined to accommodate a difference between the volumetric thermal expansion coefficients of the filling material 32 and the structured substrate 12E material. Subsequently, one or more aspects (e.g., an amount of time) of a solution used to incorporate the filler material 32 can be adjusted based on the target filling factor.

The filler material 32 can be incorporated into the voids (e.g., cavities 16A, 16B) of the structured substrate 12E using any solution. For example, the filler material 32 can be deposited into the cavities 16A, 16B using annealing, electroplating, and/or the like. In an embodiment, the deposition process, such as high temperature annealing, also can cause the filler material 32 to penetrate the substrate material, e.g., resulting in the formation of dendritic structures of the filler material 32 penetrating the substrate material from the cavities 16A, 16B and/or the opposing surface 14B. Additionally, such dendritic structures can be formed, for example, during etching of the structured substrate 12E and subsequently at least partially filled by the filler material 32.

A compound substrate 30 including a structured substrate 12E with filler material 32 can significantly improve thermal management of a device formed from a heterostructure epitaxially grown on the compound substrate 30. For example, the filler material 32 can comprise a metal. In a more particular embodiment, the metal is chosen from a group of highly thermally conductive metals, such as silver, copper, and/or the like. Alternatively, the filler material 32 can comprise another material having excellent thermal conductive properties, such as polycrystalline diamond, or the like. The presence of such filler material 32 within the voids of the structured substrate 12E can reduce a thermal boundary resistance for the compound substrate 30 as compared to a prior art substrate, e.g., due to a significant increase in contact area between the structured substrate 12E material and an underlying submount used for removing heat from the device.

Figure 6:
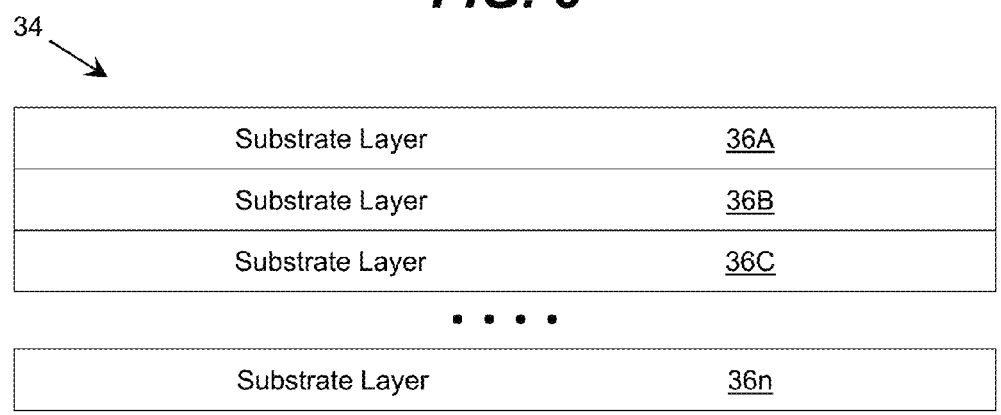
FIG. 6 shows a schematic of an illustrative compound substrate including an arbitrary number of substrate layers according to an embodiment.

A compound substrate described herein can include any number of two or more layers of material. To this extent, FIG. 6 shows a schematic of an illustrative compound substrate 34 including an arbitrary number of rigidly attached substrate layers 36A-36n according to an embodiment. In an embodiment, one or more of the substrate layers 36A-36n comprises a structured substrate as described herein. In a further embodiment, one or more of the substrate layers 36A-36n comprises a layer of a filler material described herein. It is understood that one or both surfaces of an interior substrate layer, such as substrate layers 36B, 36C, that are attached to adjacent substrate layers can be structured as described herein. While shown as having substantially uniform thicknesses, it is understood that the substrate layers 36A-36n can have any combination of: varying thicknesses; varying materials; varying structure; and/or the like. Inclusion of different substrate layers 36A-36n in a laminated composite substrate 34 can influence, for example, an overall thermal expansion coefficient of the stack of substrate layers 36A-36n, which can reduce overall stresses in the epitaxially grown semiconductor layer(s) 20 (FIG. 1).

Two immediately adjacent substrate layers 36A-36n can be rigidly attached to one another using any solution. For example, a bonding material can be used to attach each of the substrate layers 36A-36n to one another. In an embodiment, the filler material 32 (FIG. 5) comprises the bonding material. Regardless, the bonding material can be applied to a surface of one or both of the adjacent substrate layers 36A-36n, which can subsequently be pressed together. Any bonding material can be utilized for each attached pair of substrate layers 36A-36n, which can be selected based on the materials of the substrate layers 36A-36n being bonded using any solution. In an embodiment, the bonding material for a pair of substrate layers 36A-36n is silicon dioxide, which is applied between the two substrate layers and the composite substrate can be subsequently heated and/or subjected to elevated pressure. However, it is understood that other suitable bonding materials can be utilized. Regardless, the particular bonding material must be capable of withstanding the growth temperatures utilized for growth of the semiconductor heterostructure on the compound substrate.

In an illustrative embodiment, the substrate materials for the substrate layers 36A-36n are selected based on the corresponding thermal expansion coefficient, $\alpha_i$, of the substrate materials and the material of the semiconductor layer 20. For example, for a semiconductor layer 20 having a thermal expansion coefficient, $\alpha_f$, grown over the substrate 30 (FIG. 5), the materials for the substrate layers 12E, 32 can be selected such that the corresponding thermal expansion coefficients $\alpha_a$, $\alpha_b$, respectively, satisfy either the formula $\alpha_a \leq \alpha_f \leq \alpha_b$ or $\alpha_b \leq \alpha_f \leq \alpha_a$. In a more particular embodiment, the materials satisfy either the formula $\alpha_a < \alpha_f < \alpha_b$, $\alpha_a < \alpha_f < \alpha_b$ or $\alpha_a > \alpha_f > \alpha_b$. For example, for a semiconductor film grown on a substrate with a lower thermal expansion coefficient, the semiconductor film will experience tensile stresses during cool down, and some of these tensile stresses can be mitigated by the presence of a material with a higher thermal coefficient. Alternatively, for a semiconductor film grown on a substrate with higher thermal expansion coefficient, the semiconductor film will experience compressive stresses during cool down, and some of these compressive stresses can be mitigated by the presence of a material with a lower thermal coefficient. The particular substrate layer on which growth is performed can be selected based on the corresponding application for the heterostructure using any solution. For example, the substrate layer can be selected based on one or more of: consideration of stresses during growth, suitability for growth of the semiconductor material, functionality provided during operation of the device (e.g., lower temperature, light extraction, etc.), and/or the like.

In a more particular embodiment, a composite thermal expansion coefficient for a substrate 10C described herein that varies as a function of temperature in a temperature range between room temperature and/or operating temperature and a highest epitaxial growth temperature is selected to reduce tensile stresses within the epitaxially grown semiconductor film 22 (FIG. 2) when measured at room or operating temperature. In general, optimization of the composite thermal expansion coefficient over a temperature range can be expressed as:

$$\sigma = E(\int_{T_{high}}^{T_{low}} [\alpha_f(T) - \alpha_c(T)] dT),$$

where $\alpha_c(T)$ is chosen to minimize $\sigma$. In an embodiment, the composite thermal expansion coefficient for multiple temperatures spaced in a temperature range between room temperature and a highest epitaxial growth temperature can be selected to substantially match (e.g., within +/-10%) a temperature averaged dependence of the thermal expansion coefficient $\alpha_f$ of the semiconductor film 22 for each of the corresponding temperatures. Alternatively, the composite thermal expansion coefficient can be selected to substantially match (e.g., within +/-10%) a thermal expansion coefficient $\alpha_f$ of the semiconductor film 22 at room temperature. It is understood that each layer 36A-36n can comprise a structured substrate layer including cavities and/or pillars. Furthermore, a layer 36A-36n can comprise a composite layer including a matrix layer having voids and a filler material deposited within the voids.

Figure 7A:
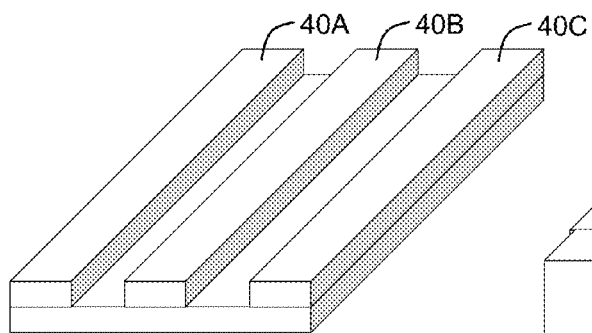
FIGS. 7A-7D show illustrative substrate patterns according to embodiments.
Figure 7C:
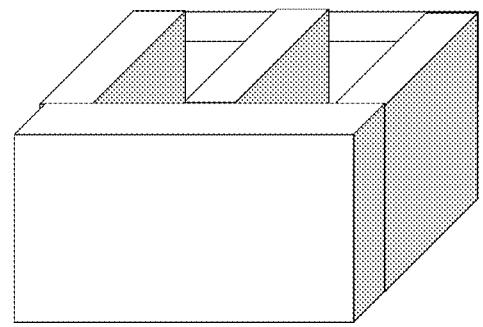
Figure 7B:
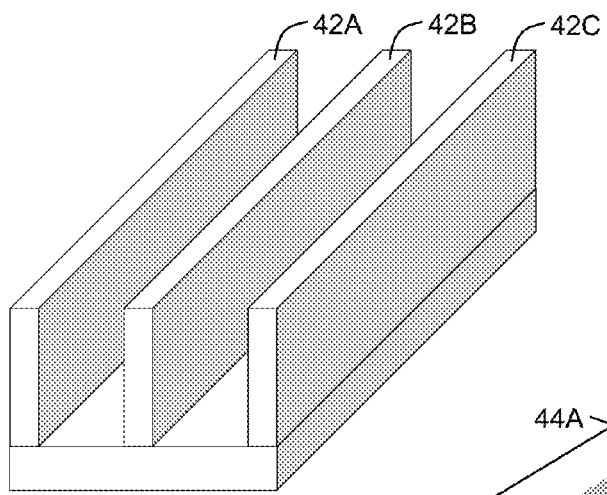
Figure 7D:
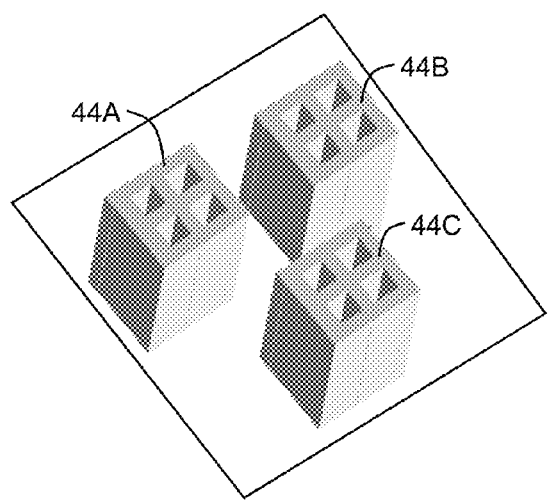

As described herein, a structured substrate can be patterned with cavities and/or pillars, e.g., to alter mechanical and/or thermal characteristics of the substrate material in a desired manner. FIGS. 7A-7D show illustrative substrate patterns according to embodiments. For example, as shown in FIG. 7A, the patterning forms shallow fins 40A-40C, while FIG. 7B shows a patterning forming long protruding fins 42A-42C. In FIG. 7C, the patterning is shown forming a mesh, while in FIG. 7D, the patterning is shown forming pillars 44A-44C having a first length scale, each of which includes cavities having a second, smaller length scale, which form a mesh structure within each pillar 44A-44C.

Figure 8:
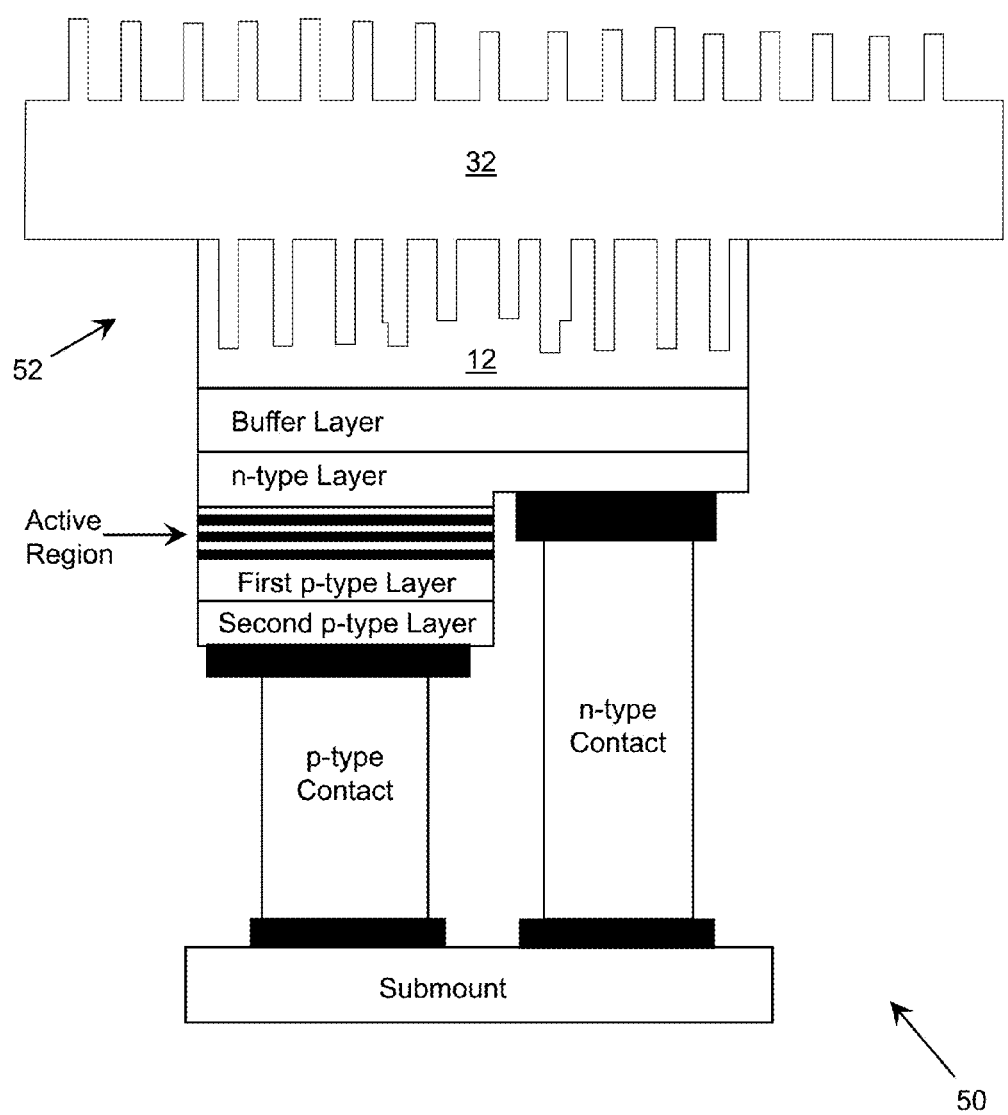
FIG. 8 shows a schematic of an illustrative emitting device according to an embodiment.

A substrate described herein can be utilized to fabricate any of various types of electronic and optoelectronic devices. In an embodiment, the device is an emitting device, such as an LED, laser diode, and/or the like. To this extent, FIG. 8 shows a schematic of an illustrative emitting device 50 according to an embodiment. In this case, the emitting device 50 includes a compound substrate 52 formed of a structured substrate 12 and a layer of filler material 32. While the emitting device 50 is shown having a flip-chip design, in which radiation from the active region is emitted through the compound substrate 52, it is understood that this is only illustrative of various device designs. To this extent, an embodiment of a substrate described herein, such as the compound substrate 52, can be incorporated in an LED having an alternative design configuration, such as a vertical LED design, which incorporates transparent or semitransparent contacts.

Figure 9:
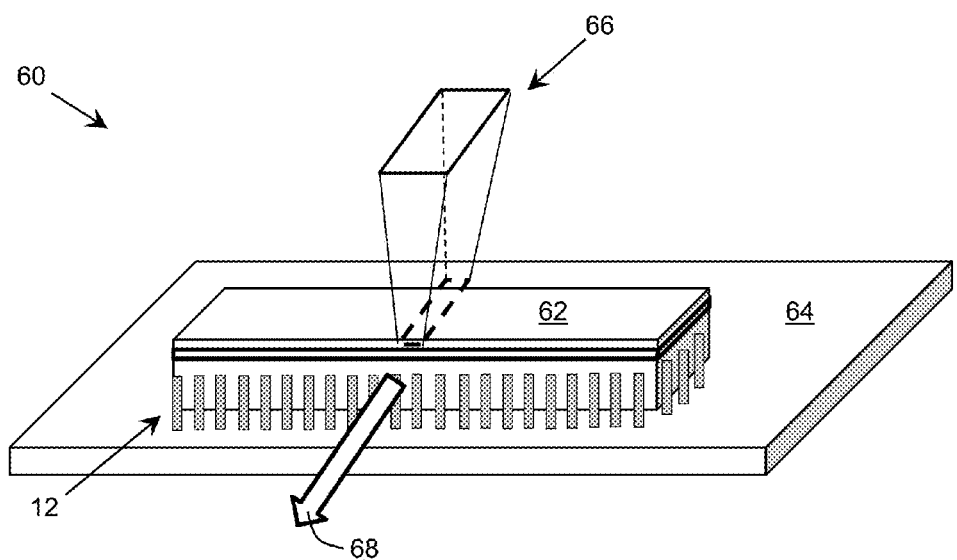
FIG. 9 shows a schematic of an illustrative laser device according to an embodiment.

FIG. 9 shows a schematic of an illustrative laser device 60 according to an embodiment. As illustrated, the device 60 includes a heterostructure 62, which is epitaxially grown on a structured substrate 12. The structured substrate 12 is adhered to a heat sink 64 using any solution. During operation of the device 60, e-beam or optical pumping 66 can be utilized to induce emission of a laser 68 through the edge of the heterostructure 62. In a more particular embodiment, the structured substrate 12 is silicon carbide and the heterostructure is a group III nitride-based heterostructure (e.g., AlGaN). The structured substrate 12 can be adhered to (e.g., via soldering) a heat sink 64 formed of, for example, copper, copper tungsten (CuW), and/or the like.

It is understood that the devices 50, 60 shown in FIGS. 8 and 9 and their corresponding configurations are only illustrative of various electronic and optoelectronic devices and device configurations for which a structured substrate described herein can be utilized. To this extent, in another embodiment, a device including a structured substrate described herein is configured to operate as a transistor, such as a field effect transistor, or the like.

Figure 10:
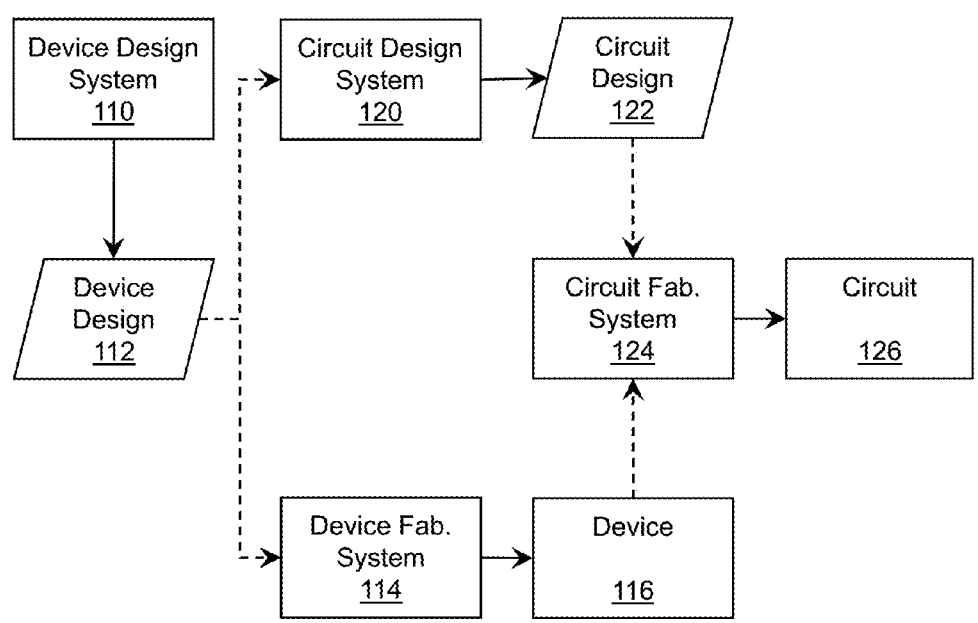
FIG. 10 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 10 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a heterostructure, the method comprising:
    selecting a target set of properties for a structured substrate based on a material of a semiconductor layer to be grown on a first surface of the structured substrate and a set of epitaxial growth conditions for the semiconductor layer; and
    fabricating a compound substrate including the structured substrate, the fabricating including:
        forming a plurality of structures within the structured substrate according to the target set of properties, wherein the forming includes:
            forming a set of pillars on a second surface of the structured substrate opposite the first surface, the set of pillars having a first length scale; and
            forming a set of cavities within each pillar in the set of pillars, the set of cavities having a second length scale smaller than the first length scale;
        forming a layer of filler material immediately adjacent to the second surface of the structured substrate; and
        annealing the filler material into a plurality of voids in the structured substrate, the plurality of voids including the set of cavities.

2. The method of claim 1, further comprising growing the semiconductor layer directly on the first surface of the structured substrate after the forming the plurality of structures.

3. The method of claim 1, wherein the forming the plurality of structures includes forming a plurality of pillars, wherein the plurality of pillars have a characteristic width between approximately 10 nanometers and approximately 10 microns and a characteristic separation distance similar to the characteristic width.

4. The method of claim 1, wherein the forming the plurality of structures further includes forming a plurality of conical cavities on the second surface.

5. The method of claim 4, wherein at least one of the plurality of conical cavities extends to the first surface of the structured substrate.

6. The method of claim 4, wherein the forming includes forming a plurality of pillars, the plurality of conical cavities and pillars having a uniform distribution across the second surface of the structured substrate.

7. The method of claim 1, wherein the set of cavities form a mesh structure within each pillar in the set of pillars.

8. The method of claim 1, wherein the fabricating the compound substrate further includes forming a plurality of pillars on an external surface of the layer of filler material.

9. The method of claim 1, wherein the filler material is a highly thermally conductive metal.

10. The method of claim 1, wherein the filler material is polycrystalline diamond.

11. A method of fabricating a device, the method comprising:
   selecting a target set of properties for a structured substrate based on a material of a semiconductor layer to be grown on a first surface of the structured substrate and a set of epitaxial growth conditions for the semiconductor layer;
   forming a plurality of structures within the structured substrate according to the target set of properties, wherein the forming includes:
      forming a plurality of cavities and forming a plurality of pillars on a second surface of the structured substrate opposite the first surface, wherein the plurality of cavities interchange with the plurality of pillars; and
      forming a set of small cavities within each pillar in the plurality of pillars, the set of small cavities having a length scale smaller than a length scale of the plurality of pillars; and
   growing a heterostructure for the device on the first surface of the structured substrate after the forming.

12. The method of claim 11, wherein the plurality of cavities and the plurality of pillars have a uniform distribution across the second surface of the structured substrate.

13. The method of claim 11, further comprising fabricating a compound substrate including the structured substrate and a layer of filler material immediately adjacent to the second surface of the structured substrate.

14. The method of claim 13, wherein the fabricating the compound substrate includes annealing the filler material into a plurality of voids in the structured substrate.

15. The method of claim 13, wherein the filler material is a highly thermally conductive metal.

16. A heterostructure including:
   a structured substrate including a first surface and a second surface opposite the first surface;
   a set of semiconductor layers epitaxially grown on the first surface of the structured substrate; and
   a layer of filler material immediately adjacent to the second surface of the structured substrate, wherein the filler material has a thermal expansion coefficient larger than that of a material of the structured substrate, wherein the filler material only partially fills a plurality of voids formed on the second surface of the structured substrate while a remaining portion of the plurality of voids remains unfilled, and wherein the plurality of voids includes a plurality of cavities formed within a plurality of pillars located on the second surface.

17. The heterostructure of claim 16, wherein at least one of the plurality of pillars includes a set of cavities that form a mesh structure within the at least one of the plurality of pillars.

18. The heterostructure of claim 16, wherein the set of semiconductor layers are formed of group III nitride materials.

19. The heterostructure of claim 16, wherein the filler material is one of: silver or copper.

20. The heterostructure of claim 16, further comprising a plurality of conical cavities formed on the second surface.

* * * * *